US009529021B2

(12) United States Patent
Peczalski et al.

(10) Patent No.: US 9,529,021 B2
(45) Date of Patent: Dec. 27, 2016

(54) DETERMINING CURRENT

(71) Applicant: Honeywell International Inc., Morristown, NJ (US)

(72) Inventors: Andrzej Peczalski, Eden Prairie, MN (US); Aravind Padmanabhan, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 207 days.

(21) Appl. No.: 13/946,781

(22) Filed: Jul. 19, 2013

(65) Prior Publication Data

US 2014/0021803 A1    Jan. 23, 2014

Related U.S. Application Data

(60) Provisional application No. 61/673,572, filed on Jul. 19, 2012.

(51) Int. Cl.
*G01R 19/00* (2006.01)
*G01R 15/18* (2006.01)

(52) U.S. Cl.
CPC ............ *G01R 19/00* (2013.01); *G01R 15/183* (2013.01); *Y10T 307/865* (2015.04)

(58) Field of Classification Search
CPC ....... G01R 19/00; G01R 19/22; G01R 15/183; G01R 15/185; G01R 15/18; Y10T 307/865; Y10T 307/8656
USPC ................ 324/117 R, 117 H, 126, 127, 522, 754.21,324/76.11; 340/870.07, 635, 660–664
See application file for complete search history.

(56) References Cited

U.S. PATENT DOCUMENTS

| 1,800,474 | A | * | 4/1931 | Scherer | ......................... 324/127 |
| 2007/0273298 | A1 | * | 11/2007 | Wu | ............................ 315/209 R |
| 2010/0013457 | A1 | * | 1/2010 | Nero, Jr. | ....................... 324/119 |

* cited by examiner

*Primary Examiner* — Arleen M Vazquez
*Assistant Examiner* — Lee Rodak
(74) *Attorney, Agent, or Firm* — Brooks, Cameron & Huebsch, PLLC

(57) ABSTRACT

Methods, systems, and devices for determining current are described herein. One method includes receiving power from a current conductor using a first quantity of coils of a wire around a magnetic core at least partially surrounding a portion of the current conductor, receiving an indication associated with a determined current through the current conductor from a current sensor associated with the wire, and receiving power from the current conductor using a second quantity of the coils of the wire, wherein the second quantity is determined based, at least in part, on the determined current.

18 Claims, 2 Drawing Sheets

DETERMINING CURRENT

RELATED APPLICATION

This application claims priority to U.S. Provisional Application Ser. No. 61/673,572 (entitled SELF-POWERED CURRENT SENSOR, filed Jul. 19, 2012) which is incorporated herein by reference.

TECHNICAL FIELD

The present disclosure relates to methods, systems, and devices for determining current.

BACKGROUND

A current through a current conductor (e.g., a power cord) may be determined (e.g., sensed, acquired, and/or measured) based on a magnetic field generated by the current conductor as the current passes through the current conductor. Determining current based on a magnetic field may allow the current to be determined without interrupting current through the current conductor, for example.

Determining current (e.g., current sensing) may be desirable, in various implementations, to manage energy (e.g., in smart grid transmission, submetering, etc.). For example, determining current may allow the monitoring of current waveforms which may indicate various health problems of a number of electrical power grid components (e.g., motors, compressors, pumps, etc.), for instance. Additionally, determining current may allow the monitoring of energy usage and/or power frequency which may allow predicting imminent power outages, for instance.

Using currently available current sensors may include costs associated with purchasing and/or replacing power components such as wiring, transformers and/or batteries, among others. As a result, previous approaches may be subject to increased acquisition, installation, and/or maintenance costs.

DETAILED DESCRIPTION

Figure 1:
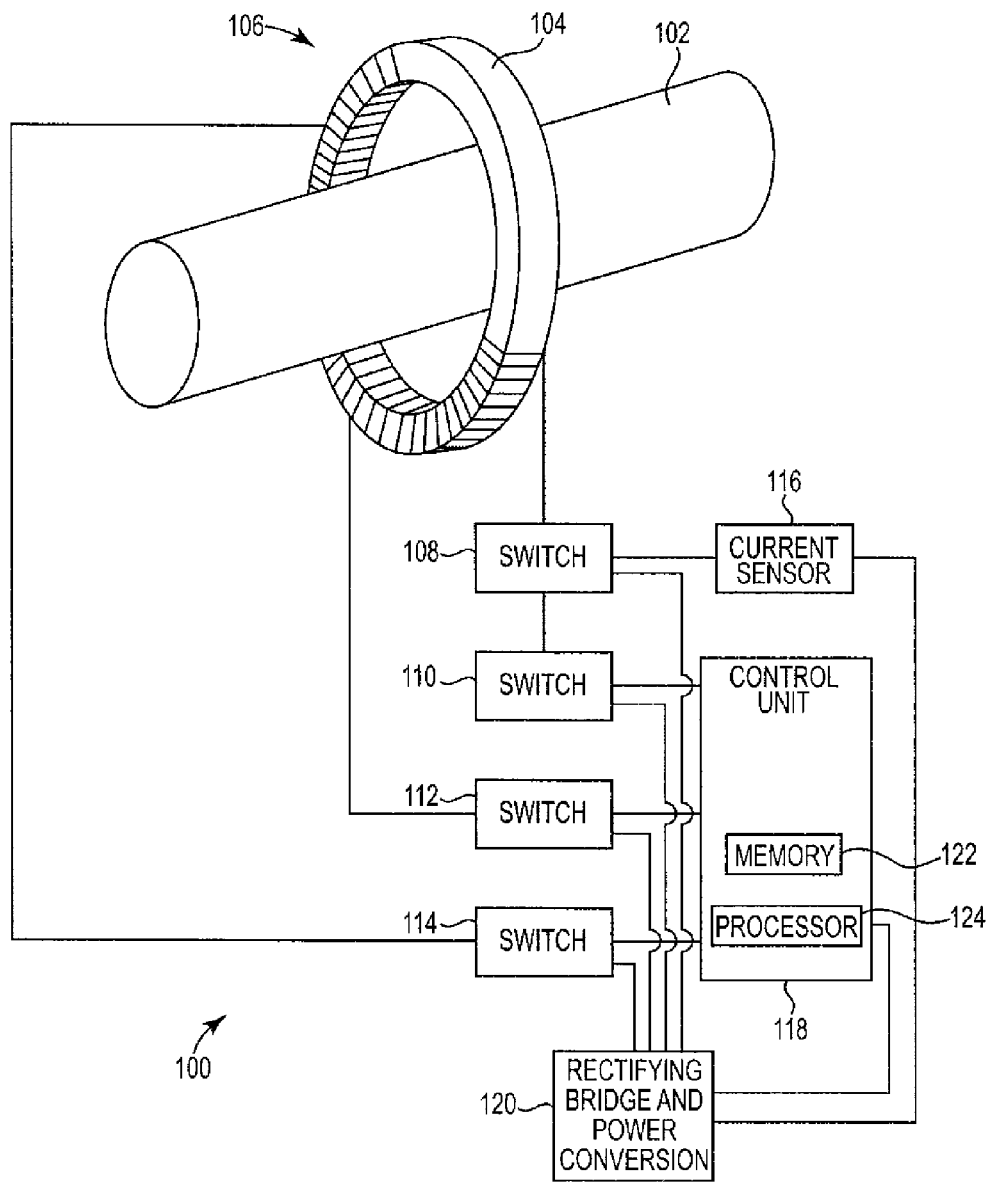
FIG. 1 illustrates a system for determining current in accordance with one or more embodiments of the present disclosure.

Methods, systems, and devices for determining current are described herein. One embodiment includes receiving power from a current conductor using a first quantity of coils of a wire around a magnetic core at least partially surrounding a portion of the current conductor, receiving an indication associated with a determined current through the current conductor from a current sensor associated with the wire, and receiving power from the current conductor using a second quantity of the coils of the wire, wherein the second quantity is determined based, at least in part, on the determined current.

Various embodiments can be self-powered and capable of operating, for example, in the absence of external power sources. Such embodiments can reduce costs associated with external power sources compared to previous approaches.

Embodiments of the present disclosure can, for example, convert energy of a magnetic field generated by a current conductor into electric energy. As opposed to previous approaches which may include making contact (e.g., electrical contact) with the current conductor, embodiments of the present disclosure can "scavenge" (e.g., draw) energy (e.g., power) from a current conductor without contacting the current conductor.

Accordingly, embodiments of the present disclosure can reduce costs associated with purchasing and/or replacing power components such as wiring, transformers and/or batteries. Further, embodiments of the present disclosure can reduce acquisition, installation, and/or maintenance costs. For example, existing methods of sensing current may use current transformers.

Embodiments of the present disclosure can utilize existing and/or installed current transformers to scavenge power, for instance. Embodiments of the present disclosure can increase energy scavenging efficiency by using a low turn-on voltage diode bridge (e.g., 0.5 V) and switchable loads, for instance, among other components.

Various embodiments discussed herein can scavenge energy between current measurement events (e.g., instances in which the current sensor is sensing current associated with the current conductor). Additionally, embodiments of the present disclosure can scavenge energy at various current levels by, for example, varying (e.g., switching) a number of winding turns used to scavenge the energy based on a measured current level.

For example, a low measured current can be scavenged by embodiments of the present disclosure using a large number of scavenging turns to scavenge a threshold (e.g., sufficient) voltage for a rectifying bridge. At high measured current(s), embodiments of the present disclosure can reduce the number of scavenging turns because, for example, a high scavenged voltage may exceed a particular (e.g., maximum and/or safe) level for various scavenging components such as a rectifying bridge and/or capacitor, for instance.

The drawings show by way of illustration how one or more embodiments of the disclosure may be practiced. These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure, and should not be taken in a limiting sense.

As used herein, "a" or "a number of" something can refer to one or more such things. For example, "a number of coils" can refer to one or more coils.

FIG. 1 illustrates a system 100 for determining current in accordance with one or more embodiments of the present disclosure. As shown in FIG. 1, system 100 includes a magnetic core 104 surrounding a portion of a current conductor 102 conducting a current. Though magnetic core 104 is shown as being substantially ring-shaped, embodiments of the present disclosure do not limit magnetic core 104 to a particular shape. For example, in various embodiments, magnetic core 104 can be composed of a plurality of components such that magnetic core 104 can be clipped around a portion of current conductor 102 without cutting or otherwise disconnecting current conductor 102.

As shown in FIG. 1, wire 106 can be wound around a portion of magnetic core 104, thereby forming a number of coils (e.g., turns and/or winds). Wire 106 can conduct a current through the coils around magnetic core 104 and can be connected to a burden (e.g., load) resistor (not shown in FIG. 1), for instance. A current sensor 116 can be configured to determine a current through current conductor 102.

Embodiments of the present disclosure do not limit current sensor 116 to a particular type. Also, though one current sensor is illustrated in FIG. 1, embodiments are not limited to a particular number of current sensors. In various embodiments, coils of wire 106 surrounding magnetic core 104 can be connected to a resistor (e.g., a portion of current sensor 116) and a voltage at the resistor may be proportional to the current flowing through current conductor 102.

Wire 106 can be connected at various locations to a number of switches. As shown in the embodiment illustrated in FIG. 1, wire 106 can be connected to a switch 108, a switch 110, a switch 112, and/or a switch 114, herein sometimes referred to generally as "switches 108-114."

For purposes of illustration, connections between various components included in FIG. 1 are illustrated as single lines. Such illustration is not to be taken in a limiting sense as embodiments of the present disclosure do not limit a single line, as shown in FIG. 1, to a particular type or number of wire(s) and/or connection(s). For example, connections between switches 108-114, wire 106, and/or control unit 118 can include two wires in embodiments where switches 108-114 are two pole switches, for instance.

Switches 108-114 can regulate a number of coils of wire 106 through which the current is conducted around magnetic core 104. That is, each of switches 108-114 can be associated with (e.g., connected to) a number of coils of wire 106.

For example, switch 108 and/or switch 110 can be associated with a first number of coils (e.g., 900) of wire 106. Switch 112 can be associated with a second number of coils (e.g., 90) of wire 106. Switch 114 can be associated with a third number of coils (e.g., 10) of wire 106. Switches 108-114 can be two pole switches that can disconnect (e.g., automatically disconnect) a remainder of coils of wire 106 in excess of a number of coils of wire 106 used to scavenge power, for instance.

A selected number of coils of wire 106 (e.g., selected based on opening and/or closing of switches 108-114) can be connected, via switches 108-114, to rectifying bridge and power conversion component 120. Rectifying bridge and power conversion component 120 can include, for example, a number of Zener diodes, a number of rectifiers (e.g., bridge rectifiers), a number of capacitors, and/or a number of power converters (e.g., AC to DC power converters), among other components.

Rectifying bridge and power conversion component 120 can convert AC power to DC power before it is received by control unit 118, for instance. In various embodiments, rectifying bridge and power conversion component 120 can convert AC current and/or varying voltage to DC current and/or fixed voltage (e.g., set at 5V), for instance. Control of switches 108-114 (e.g., causing the opening and/or closing of switches 108-114) can be carried out by control unit 118, for instance. Control unit 118 can, for example, be a computing device having a memory 122 (e.g., storing a set of executable instructions) and a processor 124 (e.g., configured to execute the executable instructions). Control unit 118 can include firmware that executes instructions to control various operations of system 100 (e.g., opening and/or closing of switches 108-114), though embodiments of the present disclosure are not so limited. For example, control unit 118 can include an integrated circuit and/or logic to perform a number of the functionalities described herein.

As shown in the embodiment illustrated in FIG. 1, control unit 118 can include a memory 122 and a processor 124. Memory 122 can be any type of storage medium that can be accessed by processor 124 to perform various examples of the present disclosure. For example, memory 122 can be a non-transitory computer readable medium having computer readable instructions (e.g., computer program instructions) stored thereon that are executable by processor 124 for determining current in accordance with one or more embodiments of the present disclosure.

Memory 122 can be volatile or nonvolatile memory. Memory 122 can also be removable (e.g., portable) memory, or non-removable (e.g., internal) memory. For example, memory 122 can be random access memory (RAM) (e.g., dynamic random access memory (DRAM) and/or phase change random access memory (PCRAM)), read-only memory (ROM) (e.g., electrically erasable programmable read-only memory (EEPROM) and/or compact-disc read-only memory (CD-ROM)), flash memory, a laser disc, a digital versatile disc (DVD) or other optical disk storage, and/or a magnetic medium such as magnetic cassettes, tapes, or disks, among other types of memory.

Further, although memory 122 is illustrated as being located in control unit 118, embodiments of the present disclosure are not so limited. For example, memory 122 can also be located internal to another computing resource (e.g., enabling computer readable instructions to be downloaded over the Internet or another wired or wireless connection).

A state (e.g., connected or disconnected) of each of the number of switches 108-114 can be controlled (e.g., adjusted, changed, etc.) responsive to one or more commands from control unit 118. That is, control unit 118 can cause one or more of the number of switches 108-114 to open (e.g., disconnect) and/or close (e.g., connect).

Controlling and/or manipulating the number of switches 108-114 can allow for more or fewer coils of wire 106 to conduct the current around magnetic core 104. For example, switch 112 and switch 114 can allow for a combination of the second number of coils (e.g., 90) and the third number of coils (e.g., 10) to form a combined number of coils (e.g., 100). Similarly, a number of various combinations can be created using various numbers of switches 108-114.

Switch 108 can allow wire 106 to be connected to current sensor 116 for sensing the current through current conductor 102. Such current sensing can be carried out at a particular interval or according to a predetermined schedule (e.g., once per five minutes), for instance, and/or at other times. Embodiments of the present disclosure can scavenge energy from current conductor 102 based on the current sensed by current sensor 116. Such scavenged energy can be used to power current sensor 116, for instance, among other uses.

Embodiments of the present disclosure can vary between modes of current sensing and energy scavenging. For example, current through current conductor 102 can be sensed at times when energy is not being scavenged from current conductor 102 (e.g., so as to not disturb measurement in current sensing). Such varying can be controlled by switching switch 108, for instance, between switch 110 and/or current sensor 116.

Sensing current and scavenging power simultaneously may be undesirable because, for instance, scavenging power can distort sensing of current sensor 116. For example, a power converter (e.g., of rectifying bridge and power conversion component 120) may extract power from current conductor 102 and can alter one or more waveforms used by embodiments of the present disclosure to determine the current through current conductor 102. A voltage below a particular threshold may be difficult to convert to electric energy (e.g., scavenge) efficiently. Regulation of a number of coils of wire 106 through which the current is conducted around magnetic core 104 can be dynamic to respond to changes in current through current conductor 102 caused by various applications.

Various operations of switches 108-114 can be controlled (e.g., monitored, adjusted, regulated, etc.) by control unit 118. For example, a number of coils of wire 106 conducting the current around magnetic core 104 to rectifying bridge and power conversion component 120 can be controlled by control unit 118 controlling a number of switches 108-114.

Control unit 118 can receive various information from switches 108-114 (e.g., switch-status data) and/or current sensor 116 (e.g., sensed current through current conductor 102). Control unit 118 can make various determinations and/or control various operations of system 100 based on received information.

For example, control unit 118 can receive a signal indicating a reduced (e.g., low) current sensed by current sensor 116 and can, via switches 108-114, allow an increased number of coils of wire 106 to conduct the current around magnetic core 104 (e.g., 1000 coils). An increased number of coils of wire 106 can allow sufficient scavenged voltage for operation of various components of system 100 (e.g., rectifying bridge(s)) and/or sufficient scavenging efficiency.

For example, control unit 118 can receive a signal indicating an elevated (e.g., high) current sensed by current sensor 116 and can, via switches 108-114, allow a decreased number of coils of wire 106 to conduct the current around magnetic core 104 (e.g., 10 coils). A decreased number of coils of wire 106 can allow system 100 to avoid voltage(s) exceeding a particular (e.g., safe) level (e.g., greater than 100 Volts) for various components of system 100 (e.g., rectifying bridge(s), capacitor(s) (included in rectifying bridge and power conversion component 120), etc.). Further, control unit 118 can determine various combined numbers of coils, as previously discussed, based on various ranges of sensed currents.

Figure 2:
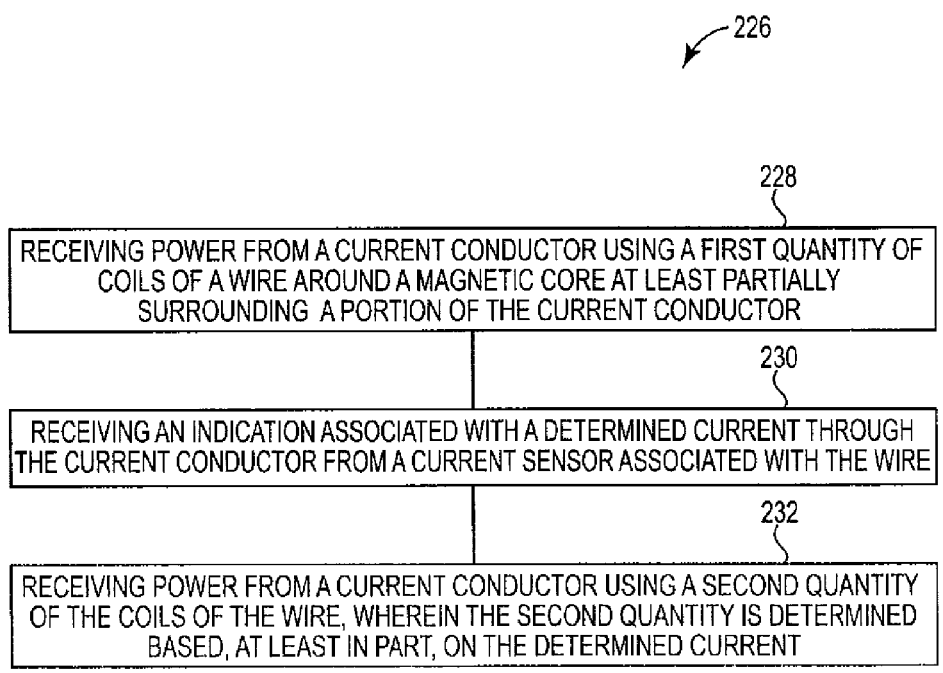
FIG. 2 illustrates a method for determining current in accordance with one or more embodiments of the present disclosure.

FIG. 2 illustrates a method 226 for determining current in accordance with one or more embodiments of the present disclosure. Method 226 can be performed by control unit 118 (previously discussed in connection with FIG. 1), for instance, though embodiments of the present disclosure are not so limited.

At block 228, method 226 includes receiving power from a current conductor using a first quantity of coils of a wire around a magnetic core at least partially surrounding a portion of the current conductor. Power from the current conductor in a manner analogous to that previously discussed in connection with FIG. 1, for instance.

At block 230, method 226 includes receiving an indication associated with a determined current through the current conductor from a current sensor associated with the wire. Such an indication can be received following a change in a switch from a first state (e.g., energy scavenging) to a second state (e.g., current sensing). The indication can indicate a particular level of current (e.g., low or high) through the current conductor.

At block 232, method 226 includes receiving power from the current conductor using a second quantity of the coils of the wire, wherein the second quantity is determined based, at least in part, on the determined current. Power can be received using the second quantity of coils, for example, following a change in the switch from the second (e.g., open) state to the first (e.g., closed) state (e.g., a change in a state of switch 110), as previously discussed. In some embodiments, the second quantity may exceed the first quantity. In other embodiments the first quantity may exceed the second quantity. Further, the second quantity can include the first quantity (e.g., 1000 coils includes 900 coils) and the second quantity may not include the first quantity (e.g., 10 coils does not include 900 coils).

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for determining current, comprising:
   receiving power from a current conductor using a first quantity of coils of a wire around a magnetic core at least partially surrounding a portion of the current conductor, the first quantity of coils being associated with at least one closed switch of at least a first switch and a second switch, wherein the first switch is connected to a first subset of the coils of the wire, wherein the second switch is connected to a second subset of the coils of the wire, and wherein none of the first subset is included in the second subset;
   receiving an indication associated with a determined current through the current conductor from a current sensor associated with the wire; and
   receiving power from the current conductor using a second quantity of the coils of the wire, the second quantity of coils being associated with at least two closed switches of the at least first switch and a second switch, wherein the second quantity is determined based, at least in part, on the determined current.

2. The method of claim 1, wherein the method includes:
   receiving the indication associated with the determined current following a change in a switch from a first state to a second state; and receiving power from the current conductor using the second quantity of the coils of the wire following a change in the switch from the second state to the first state.

3. The method of claim 1, wherein the method includes:
receiving the indication, wherein the indication is associated with a reduced current; and
receiving power from the current conductor using the second quantity of the coils of the wire, wherein the second quantity exceeds the first quantity.

4. The method of claim 1, wherein the method includes:
receiving the indication, wherein the indication is associated with an increased current; and
receiving power from the current conductor using the second quantity of the coils of the wire, wherein the first quantity exceeds the second quantity.

5. The method of claim 1, wherein the second quantity of coils of the wire includes the first quantity of coils of the wire.

6. The method of claim 1, wherein the second quantity of coils of the wire does not include the first quantity of coils of the wire.

7. The method of claim 1, wherein the method includes:
receiving the indication associated with the determined current; and
receiving power from the current conductor using the second quantity of the coils of the wire, wherein the second quantity is equal to the first quantity.

8. The method of claim 1, wherein the method includes not contacting the current conductor.

9. The method of claim 1, wherein the method includes receiving another indication associated with another determined current a particular period of time after receiving the indication associated with the determined current.

10. The method of claim 9, wherein the method includes receiving the other indication associated with the other determined current after receiving power from the current conductor using the second quantity of coils of the wire.

11. A system for determining current, comprising:
a magnetic core associated with a current conductor, wherein the magnetic core is wound by a plurality of wire coils associated with a current sensor;
a first switch connected to a first subset of the plurality of wire coils and a second switch connected to a second subset of the plurality of wire coils, wherein none of the first subset is included in the second subset; and
a controller, configured to:
receive an indication associated with a particular level of a current through the current conductor determined by the current sensor;
cause the first switch and the second switch to be closed based, at least in part, on the received indication; and
receive power from the current conductor using the first subset and the second subset of the plurality of wire coils.

12. The system of claim 11, wherein the system is not connected to an external power source.

13. The system of claim 11, wherein the controller is configured to receive a respective indication associated with each of a plurality of determined power levels, and wherein the plurality of determined power levels are determined sequentially at a particular interval.

14. The system of claim 13, wherein the controller is configured to receive power from the current conductor between the sequential determinations of power levels at the particular interval.

15. The system of claim 11, wherein the system includes a rectifying bridge and power conversion component, and wherein the rectifying bridge and power conversion component includes:
at least one zener diode;
at least one rectifying bridge; and
at least one capacitor.

16. The system of claim 11, wherein the rectifying bridge and power conversion component is connected to each of the first and second switches, and wherein the controller is configured to cause at least one of the first and second switches to be closed based on a threshold voltage associated with a rectifying bridge of the rectifying bridge and power conversion component.

17. A non-transitory computer-readable medium having instructions stored thereon executable by a processor to:
determine a current through a current conductor while the current conductor is conducting the current using a magnetic core at least partially surrounding a portion of the current conductor, wherein the magnetic core is wound by a plurality of wire coils;
determine a number of the plurality of wire coils around the core to conduct a current scavenged from the current conductor to a control unit responsive to the determined current, the number comprising at least one subset of the plurality of wire coils, wherein the determined number is sufficient to yield a threshold voltage in a rectifying bridge;
determine at least one switch of a plurality of switches between the magnetic core and the control unit to open; and
determine at least two switches of the plurality of switches between the magnetic core and the control unit to close, wherein the at least two switches include a first switch connected to a first subset of the plurality of wire coils and a second switch connected to a second subset of the plurality of wire coils, and wherein none of the first subset is included in the second subset.

18. The computer-readable medium of claim 17, wherein the first subset of coils is a different quantity of coils than the second subset of coils.

* * * * *